United States Patent [19]
Chitty et al.

[11] Patent Number: 4,764,244
[45] Date of Patent: Aug. 16, 1988

[54] RESONANT SENSOR AND METHOD OF MAKING SAME

[75] Inventors: Gordon W. Chitty, Norfolk; Richard H. Morrison, Jr., Taunton; Everett O. Olsen, Wrentham; John G. Panagou, Attleboro; Paul M. Zavracky, Norwood, all of Mass.

[73] Assignee: The Foxboro Company, Foxboro, Mass.

[21] Appl. No.: 743,255

[22] Filed: Jun. 11, 1985

[51] Int. Cl.[4] .................. H01L 21/306; B44C 1/22; C03C 15/00; C23F 1/02
[52] U.S. Cl. .................. 156/630; 29/25.35; 29/621.1; 156/628; 156/634; 156/653; 156/656; 156/657; 156/659.1; 156/662; 156/667; 310/321; 310/367; 73/704; 73/DIG. 4
[58] Field of Search .................. 156/628–634, 156/650–653, 655, 657, 656, 659.1, 662, 667; 310/321–325, 367–371; 29/25.35, 610 SG; 73/570, 587, 589, 649, 704, 754, DIG. 4, DIG. 1

[56] References Cited

U.S. PATENT DOCUMENTS

| | | | |
|---|---|---|---|
| 4,278,492 | 7/1981 | Cross et al. | 156/643 X |
| 4,403,202 | 9/1983 | Minagawa | 29/25.35 X |
| 4,502,932 | 3/1985 | Kline et al. | 204/192 EC |
| 4,531,267 | 7/1985 | Royer | 29/25.35 |

OTHER PUBLICATIONS

Petersen, "Dynamic Micromechanics on Silicon: Techniques and Devices", IEEE Transactions on Electronic Devices, vol. ED-25, No. 10, Oct. 1978, pp. 1241–1250.
Teschler, "Ultraminiature Mechanics", Machine Design, Jan. 8, 1981, pp. 112–117.
Pointon et al., "Piezoelectric Devices", IEEE Proceedings, vol. 129, Pt. A, No. 5, Jul. 1982, pp. 285–307.
Royer et al., "ZnO on Si Integrated Acoustic Sensor", Sensor and Actuators, 4 (1983), 357–362, May 31–Jun. 3, 1983.
J. Z., "Thin-Film Integrated Sensors Respond Down to 0.1 Hz", Electronic Products, Jun. 29, 1983, pp. 15–17.

Primary Examiner—William A. Powell
Attorney, Agent, or Firm—Terrence (Terry) Martin

[57] ABSTRACT

Microminiature resonant sensor structures are prepared according to micromachining/microfabrication techniques, which structures include thin-film deposits of piezoelectric materials. Such piezoelectric deposits may be excited electrically by including metallized conductive paths during fabrication, or optically. The resonant frequency of the sensor structure is varied by subjecting it to a physical variable, or measurand, such as pressure, temperature, flow rate, etc. Similarly, the resonant frequency of the devices may be detected electrically or optically. The microminiature resonant structures include ribbons and wires, hollow beam and cantilevered hollow beams, and single- and double-ended double beam resonant structures such as tuning forks.

22 Claims, 13 Drawing Sheets

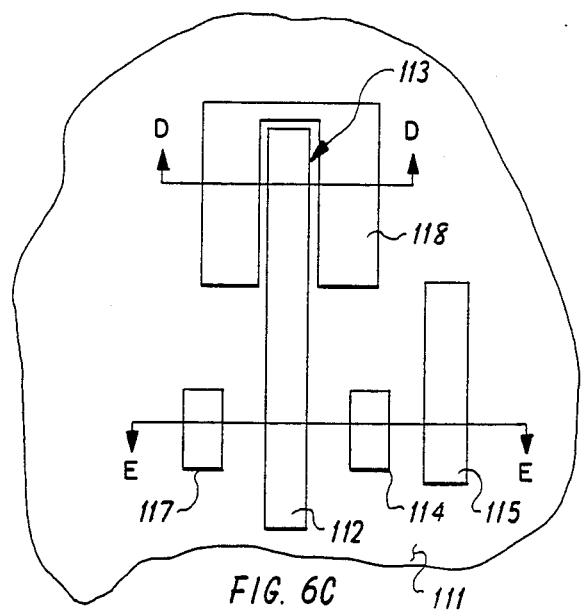
FIG. 6C
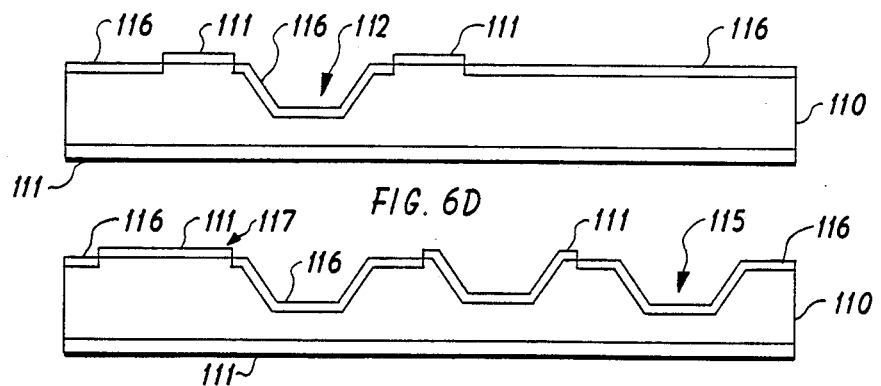
FIG. 6D
FIG. 6E

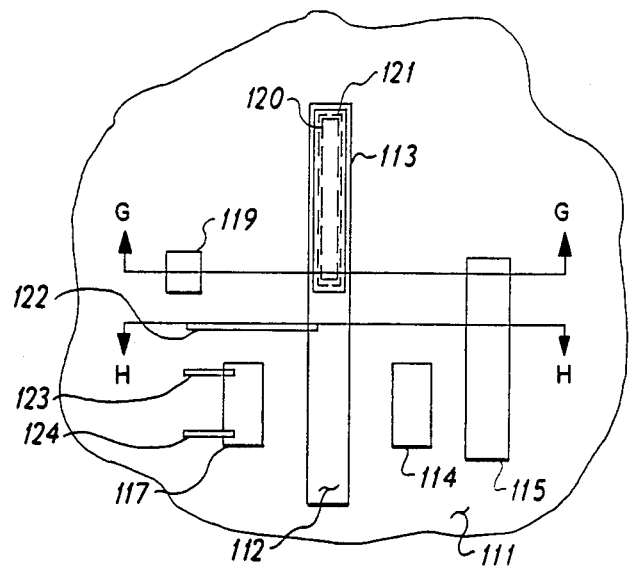
FIG. 6F
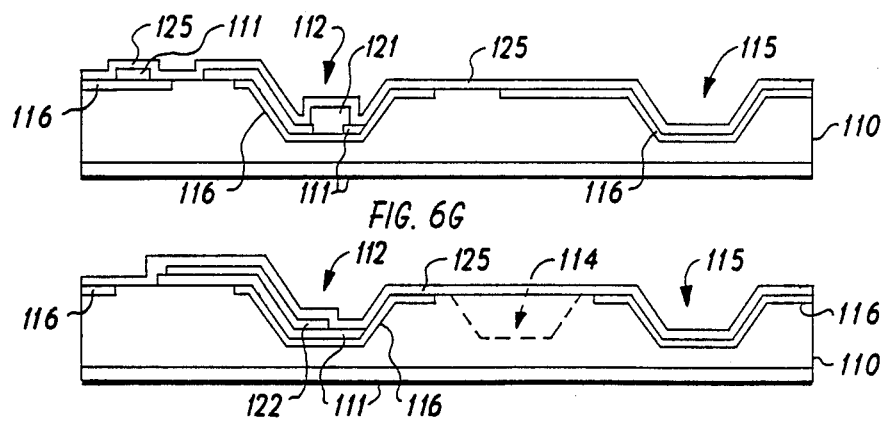
FIG. 6G
FIG. 6H

RESONANT SENSOR AND METHOD OF MAKING SAME

BACKGROUND OF THE INVENTION

1. Technical Field

The present invention relates to the field of microminiature resonant structures, especially to ribbon, wire, beam, hollow-beam and cantilevered hollow-beam, and double beam resonant structures, and more particularly to the combination of such structures with piezoelectric drive/detection methods and means, and fabrication techniques for making such miniature and microminiature resonant structures. The piezoelectric material is deposited as a thin film, and may be excited electrically or optically.

2. Background Art

Recent developments in microfabrication techniques including micromachining applicable to discrete semiconductors and to integrated circuits (IC's), have brought vast changes to the electronics industries, and have focused attention on smaller, more efficient devices capable of large-scale production at low cost.

Microfabrication and micromachining include the techniques of planar technology, wet chemical etching and other etching techniques, metallization, and metal deposition. Planar technology includes the various techniques used in integrated circuit fabrication, such as photolithography, oxide etching, thermal diffusion, ion implantation, chemical vapor deposition, and dry plasma etching.

Recognition of the need to develop microsensors having photo-optic fiber and microcomponent communications and control techniques in the process control industries has created an unfulfilled need for development of compatible new devices in these industries.

For the purposes of this limited description, "process control" includes both individual variable processes and complex multivariable processes involving a large number of controlled process conditions (or "measurands"), such as fluid flow, flow rate, temperature, pressure, level, and the like. "Station" generally refers to a place, site, base, installation, point, or locality. "Resonant structure" herein generally refers to ribbon, wire, beam, hollow-beam, cantilevered beam and cantilevered hollow-beam, and double beam articles of manufacture, and their equivalent, which can be resonated at particular oscillation frequencies. As used herein, "laminar" refers to morphology characterized by one or more relatively thin layers, as compared with the length and/or width of an object or element. In describing the process steps, the device being fabricated may be referred to as a "workpiece".

Industrial process control apparatus and techniques have evolved over a number of years from relatively simply individual variable pneumatic controllers for separate respective process conditions, to very large integrated systems including sophisticated analog and digital processing equipment with sophisticated communications (telemetering) techniques for remotely communicating the multiple process control signals to and from the site of the process control actuator, which is often a valve, switch, clutch, brake, solenoid, relay, motor or servomotor, or sensor.

The communications/telemetry process may involve (individually or in combination) pneumatic, electric, optical fiber light path, or various other communications media techniques. Converting the communications data to energy to effect change in the process control variable often involves interfacing various energy and communications techniques. Historically, such systems were large and unwieldy and often used substantial amounts of energy.

Techniques for fabrication of certain resonant elements similar to the present invention are disclosed in P. W. Barth, "Silicon Sensors Meet Integrated Circuits", CHEMTECH, November, 1982, pp. 666–673.

Other publications of interest concerning the fabrication techniques used by the present invention include: "Cadmium Sulphide and Zinc Oxide Thin Film Transducers", by N. F. Foster et al, *IEEE Transactions on Sonics* "Reactive Magnetron Sputtering of ZnO", by B. T. Khuri-Yakub et al, *J. Appl. Phys.* 52 (7), July 1981, pp. 4772–4774; "Zinc Oxide Film Transducers", by N. F. Foster et al, *Applied Physics Letters,* Vol. 8, No. 9, 1 May 66, pp. 221–223; "Preparation of ZnO Thin Films by Sputtering of the Compound in Oxygen and Argon", by G. A. Rozgony et al, *Applied Physics Letters,* Vol. 8, No. 9, 1 May 66, pp. 220–221; "Monolothic Integrated Zinc-Oxide on Silicon Pyroelectric Anemometer", by D. L. Polla et al, *IEEE IEDM* 83, CH 1973-7/83/000-0639, pp. 639–642; "Thin Zinc-Oxide Film Array for Programmable Filter and Scanned Receiving Transducer", C. T. Chung et al, *IEEE* 1979 *Ultrasonics Symposium,* IEEE CH1482-9/79/0000-0915, pp. 915–920; "Heat and Strain-Sensitive Thin-Film Transducers", R. S. Muller, *Sensors and Actuators,* 4 (Elsevier Sequoia, The Netherlands, 1983), pp. 173–182; "Piezoelectricity in Thin Film Materials," N. F. Foster, *J. Acoust. Soc. Am.* 70 (6), December 1981, pp. 1609–1614; "Thin-Film Integrated Sensors Respond Down to 0.1 Hz", pp. 15, 17; "The Piezoelectric Crystal as an Air Pollution Monitor", G. G. Guilbault, Plenary Lecture, pp. 637–643; and "Structure and Properties of Vacuum-Deposited Thin Films: A New Basic Relationship", P. S. Vincent et al, *Journal of Applied Physics,* Vol. 48, No. 9, September 1977, pp. 3800–3806.

DISCLOSURE OF THE INVENTION

The present inventive concept includes basic miniature and microminiature resonant structures in various configurations, and the methods of manufacture thereof. The preferred and alternative embodiments of the present invention address the need for miniature resonant structures which can be readily stimulated into oscillation and which can be mass produced by the adoption of semiconductor micromachining and microfabrication techniques.

These resonant structures may take the form of a ribbon, wire, hollow beam or hollow cantilevered beam, double beam resonators and the equivalent. The structures may be fabricated in large quantities by solid-state techniques. Generally, the fabrication technique includes the steps of depositing a thin film of piezoelectric material and the interconnecting structures on one or more surfaces of the resonant structure during fabrication thereof. The techniques involved in manufacturing resonant hollow beam structures are shown, for example, in U.S. application Ser. No. 709,870, by Paul M. Zavracky, Richard Morrison, and Stephen Senturia, filed Mar. 13, 1985, U.S. Pat. No. 4,614,119, the disclosure of which is herein incorporated by reference. One or more piezoelectric thin films are deposited on surface areas of the resonant structure to enable driving of the resonant structure into oscillation. Particularly advantageous in the present invention are methods of fabricating the resonant structure with the necessary thin-film piezoelectric areas, and if desired, the electrical contact leads to the piezoelectric areas. Electronics circuitry may also be incorporated in some resonator packages. Oscillation of the resonant element may be initiated and detected either electrically or optically.

Numerous variations in the materials and structures will be apparent to those of skill in the art of process control sensors. Applicants have successfully produced working experimental resonant ribbon structures which include electrical paths to the piezoelectric elements, and in which a thin film of zinc oxide (ZnO) serves as the piezoelectric element.

It is an object and advantage of the present invention to manufacture a multiplicity of these resonant structures with thin-film piezoelectric areas on a single substrate, thus enabling fast, low cost, high-volume production of these resonant devices.

Another advantage of this invention is that manufacture requires only that a limited number of standard programmable microminiature resonant structure devices be manufactured for a wide range of process control sensors.

Further objects and advantages of the invention are self-evident from the following detailed description of the preferred alternate embodiments, taken together with the accompanying drawings.

BRIEF DESCRIPTION OF THE DRAWINGS

Numerous features of the invention disclosed herein will be apparent upon examination of the several drawing figures forming a part hereof. In all views, like reference characters indicate corresponding parts:

FIGS. 6a through 6k illustrate the process for fabricating three-dimensional resonant structures and specifically, a hollow cantilever beam resonant structure;

BEST MODE FOR CARRYING OUT THE INVENTION

Due to the wide range of microfabrication techniques and the many uses to which the micromechanical resonators of the present invention may be put, several specific embodiments of the invention and examples of how they are made are included herein to illustrate the scope of the invention.

Figure 1:
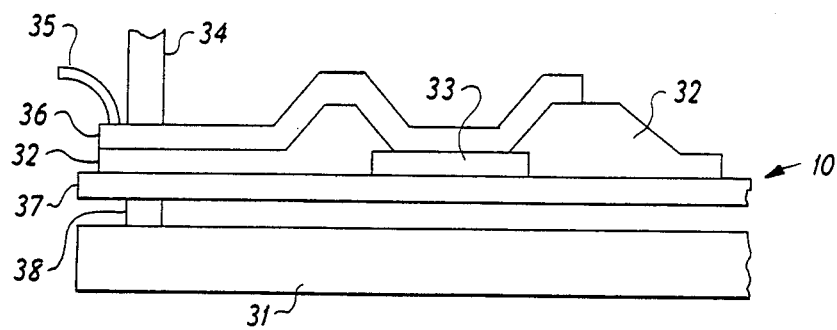
FIG. 1 is a simplified cross-section of a resonant ribbon structure incorporating a piezoelectric drive area and electrical contacts therefor, showing the basic elements of the invention in simplest form.
Figure 2:
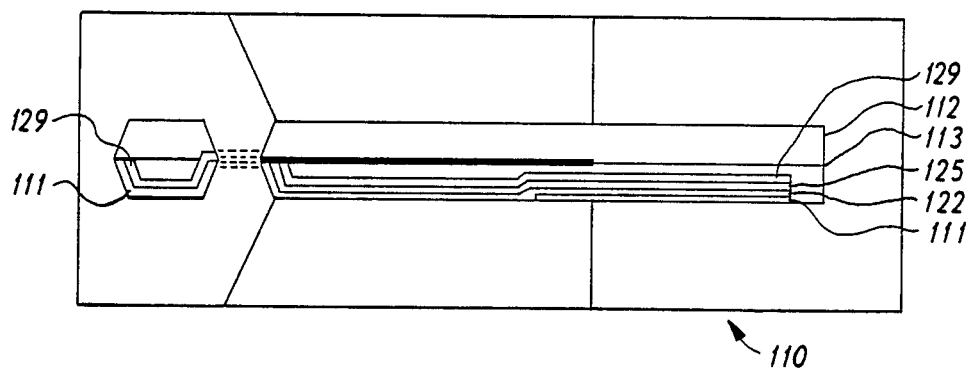
FIG. 2 illustrates a resonant hollow beam resonant structure according to the present invention, in simplified cross section view.
Figure 3A:
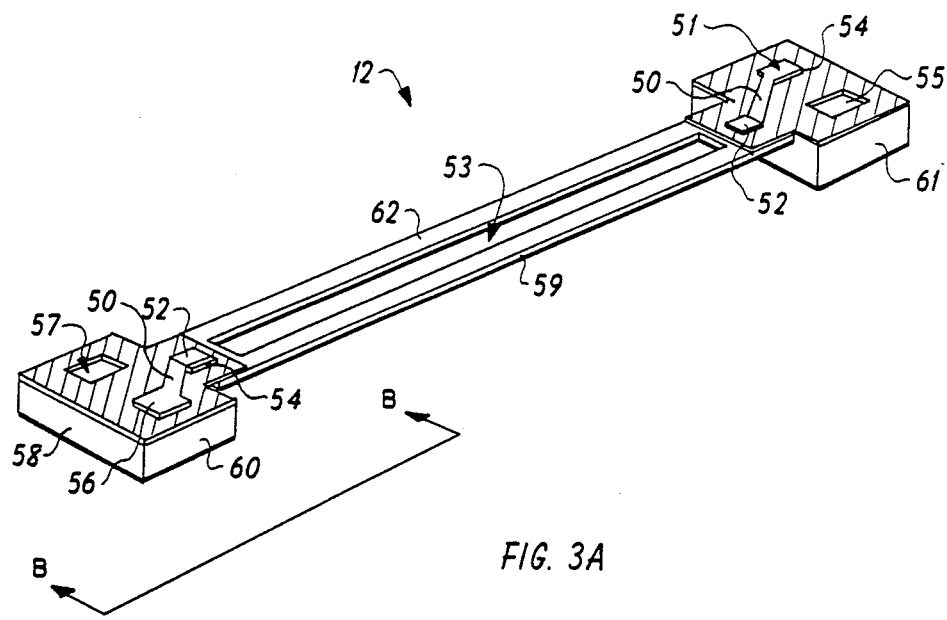
FIGS. 3a and 3b illustrate a double tuning fork resonant structure according to the present invention.
Figure 3B:
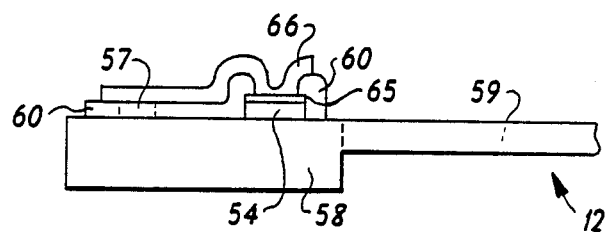

FIG. 1 illustrates pictorially the essential elements of a first embodiment of the invention wherein the resonant structure is a ribbon element formed as an integral part of the microfabrication process. FIG. 2 shows a hollow beam structure according to another embodiment of the invention. FIGS. 3a and 3b illustrate a double tuning fork.

A simplified cross-sectional view of a vibrating ribbon resonator 10 according to this invention is shown in FIG. 1, wherein a ribbon element 37 is clamped between clamp elements 34, 38 at one end [it being understood that a similar arrangement exists (not shown) at the opposite end to tension the ribbon element 37"] and suspended above a support structure or substrate 31. An insulating layer 32 covers selected portions of the upper ribbon element 37 surface. At a desired location, an area of a piezoelectric material 33 is bonded to an exposed surface area of the ribbon element 37. A metallization layer 36 provides an electrical connection between the upper clamp element 34 and the main upper surface of the piezoelectric material 33, while metallic ribbon element 37 per se provides an electrical conductor path to the other main surface of the piezoelectric material 33. By applying a periodic electrical pulse via lower clamp 38 and connecting wire 35 to the piezoelectric material, the ribbon element 37 may be stimulated into oscillation. Similarly, the frequency of an oscillating ribbon element 37 may be detected by measuring the frequency of a signal produced by stimulation of the piezoelectric material 33 via connecting wire 35 and lower clamp 38. Note that insulating layer 32 provides an electrical isolation of the ribbon element 37 from metallization layer 36.

Turning now to FIGS. 3a and 3b, there is shown a resonator of the type usually called a double tuning fork 12, shown for example on a pair of end bases or substrates 58, 61. These substrates are not required. Essentially, a pair of elongated longitudinal members 59 and 62 extend from the bases such that oscillation is possible in either direction normal to the length of the longitudinal members, or "tines", 59, 62. Double tuning forks according to the present invention are similar to resonant ribbons.

It has been found useful to include a resistance layer as a resistive current limiting or blocking layer 65 electrically in series with the connecting leads to the piezoelectric layer. This will be shown for the purposes of this disclosure generally between the piezoelectric material and a metallization layer included as a current carrier to/from the piezoelectric material.

In FIGS. 3a and 3b, a base area 58 may be included if desired to support the fork members 59 (62 is hidden from view). A piezoelectric material 54 is provided on a surface of the tuning fork at a desirable location, discussed hereinafter, by microfabrication techniques. A suitable resistance layer 65 is deposited on the upper surface of small area of piezoelectric material on the double tuning fork top surface, then an insulating material 60 is formed to cover the majority of the surface area at the end of the resonator 12. In FIG. 3b the insulating material is identified by reference member 60. A metallization layer 66 provides connection (50, 51, 52, 56) of the current-limited piezoelectric area to such external circuitry as may be required. The metallization areas forming conductors 50 of FIGS. 3a, 3b are deposited on an insulator sublayer as described, thus isolating the substrate 58 from the contact pads 51, 56 where external connections may be made for drive/detection circuitry. A channel 53 separates the two fork members 59, 62 of double tuning fork 12. Plated contacts 51, 52 provide ohmic contact to the piezoelectric material. When the double tuning fork tines 59, 62 are formed of an electrically conductive material, contact apertures 55, 57 must be opened in the surface insulator layer to permit ohmic contact with the fork member. Multiple piezoelectric areas may be formed to facilitate drive/detection of the device. When the resonator element is made from non-conductive material, an underlying conductor metallizaton layer (not shown) may be included to provide a second conductive path to the piezoelectric material 54.

PROCESSING METHODS (a) Ribbon Structures

The following is a generalized process for making piezoelectrically driven microminiature resonant structure sensor devices according to certain embodiments included in this disclosure. Generally, the procedure outlines the steps necessary to make a resonant structure sensor according to the thin metal foil lamination method of the present invention. Numerous variations will be obvious to a person of ordinary skill in the art of microfabrication. A subsequent, more detailed procedure is included, describing how ribbon resonantor structures have been successfully produced according to two particular processes; a foil lamination process and a plating process.

1. Select and prepare a suitable substrate.
2. Secure metal layer to substrate.
3. Clean exposed metal surface.
4. Photo pattern a first resist for the resonant structure by conventional methods..
5. Descum.
6. Etch resonant structure using conventional methods.
7. Clean and brake workpiece.
8. Deposit desired piezoelectric layer and then a resistive current blocking layer.
9. Pattern the blocking and piezoelectric layers and etch by conventional methods.
10. Rinse.
11. Apply an insulating layer and pattern same by conventional methods.
12. Deposit a conductive metallization layer, pattern, and etch.
13. Remove resonator.

LAMINATED FOIL PROCEDURE

Thin metal foils (including nickel, copper, chrome, gold, silver, platinum, alloys thereof, and others) have good mechnical and metallurigical properties due to the foil manufacturing and production techniques. Yield strength in the plane of the foil is high because grain boundaries are oriented parallel to the plane surface. Practical metal thicknesses used in the fabrication of resonant ribbons vary from 2 microns to 1 mm, with a typical value of 10 microns. Foils thicker than $5 \times 10^{-5}$M may not need to be laminated to a rigid substrate.

The following procedural steps describe the fabrication of a pair of thin, parallel, berylium-copper (BeCu) metal foil ribbon resonantors according to the present invention. See FIG. 4.

(1) Substrate Preparation: In order to fabricate devices using planar techniques, it is necessary to have a rigid sample. The foils (e.g., less then $5 \times 10^{-5}$M) are not rigid and therefore not alone suitable. To overcome this problem, a rigid substrate is used. The substrate can be any material having good dimensional stability, which can withstand temperatures of up to 200° C., and which is substantially resistant to all etchants used in the process. Glass is an inexpensive, readily available material, and present in the preferred form: 75 to 150 mm (3-6-inch) diameter wafers. In experimental work for the present invention "0211" cover glass, 0.25 mm (10 mil) thick, obtained from Corning Glass Company, was used and found to be appropriate.

(2) Lamination Process (FIG. 4a): The metal foil 72 must be laminated to the substrate. In the present experimental manufacture of the invention, epoxy 71 was applied to the center of the substrate 70 surface and then spread out by compressing 0.013 mm (0.5 mil) berylium-copper (BeCu) foil 72 between the epoxy 71 coated substrate 70 and a flat surface. More sophisticated techniques could be used. Attempts to uniformly apply the epoxy by screening have been successful; however, when the foil was brought into contact, bubble formation was a source of difficulty. "Five-minute" epoxy from Devcon Co. was used, but many two-part, room-temperature-curing epoxies would also work. Attempts to bond at elevated temperatures should be avoided because of possible failure due to thermal mismatch between the substrate and the foil (e.g., the laminate may curl at room temperature).

Other adhesive types tested include instant glues and cyanoacrylic adhesives. Application and curing of these materials may present problems. The adhesive used must be able to keep its integrity through the high-temperature (200° C.) processes involved. Epoxy was successfully tested and found suitable. Some epoxy formulations may lose adhesion properties at elevated temperatures. The epoxy should therefore be carefully selected to adequately secure the foil to the substrate, but not so effectively as to inhibit release of the individual structures.

Following the lamination step, the metal foil 72 surface is cleaned. These cleaning steps may, for example, include immersion in ultrasonic decontamination solution, followed by ultrasonic hot de-ionized wash, a surface etch in dilute hydrochloric acid, then rinsing.

Figure 4A:
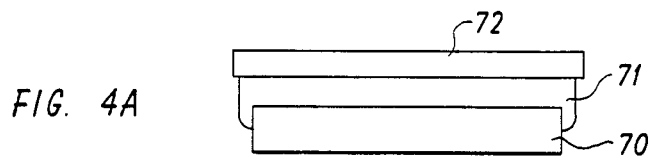
FIGS. 4a through 4g illustrate the lamination process for fabricating essentially flat resonant structures, such as ribbons or double tuning forks.
Figure 4B:
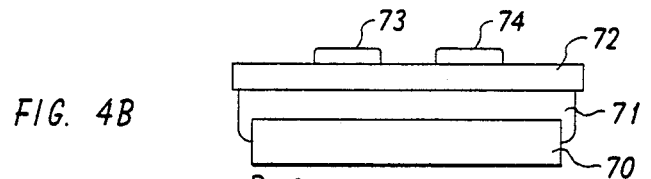

(3) Metal Etch (See FIGS. 4b and 4c): Next, the metal foil 72 of the ribbon elements 75, 76 per se is patterned and etched to form the desired resonant structure. Resist 73, 74 is applied, then exposed to a first mask to form the desired resonator shape, then developed (FIG. 4b). Other conventional patterning methods may be substituted. A planar etch step may be undertaken to de-scum the metal surface. The metal etchant may have a detrimental effect on the other layers of the device. By etching (see FIGS. 4c and 4d.) the ribbon metal first, such problems are avoided. For berylium-copper (BeCu) ribbon material, ferric chloride (FeCl$_3$) may be used as an etchant. Either bowl, tank, or spray etching would be suitable for use in a large-scale commercial production environment. It is additionally possible to use a plasma etch technique such as ion beam milling or sputter etching to decrease undercutting, at the expense of a slower etch rate and therefore throughput.

Figure 4C:
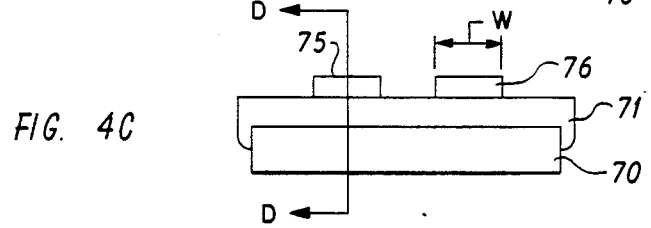
Figure 4D:
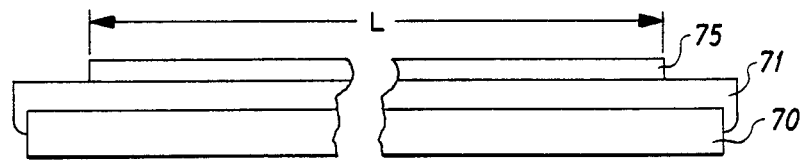
Figure 4E:
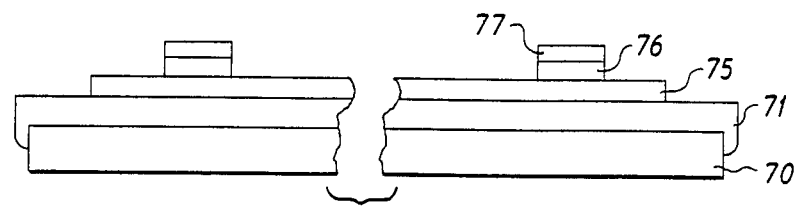
Figure 4G:
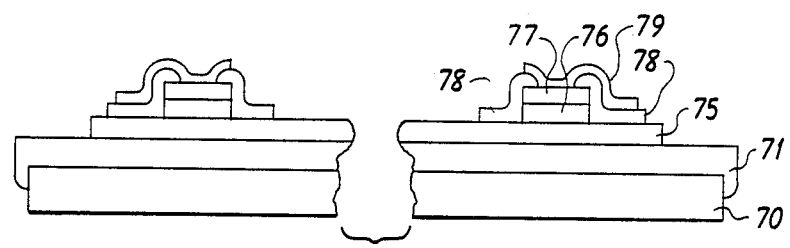
Figure 4F:
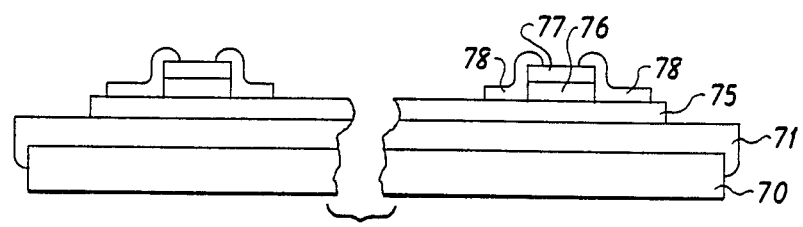

FIGS. 4d–4g illustrate a transverse section taken at line D—D of FIG. 4c, showing a single ribbon element 75 along its length, with middle portions removed for clarity of illustration.

(4) Piezoelectric Material Deposition: Piezoelectric material 76 is deposited on the ribbon 75. The thickness of this layer will affect the efficiency of the drive. The range of practical thicknesses runs from 100 nm to 100 microns, with a typical value of about 4 microns.

(a) Zinc Oxide (ZnO) Deposition: Sputtering (e.g., RF sputtering) is the preferred method for ZnO deposition; chemical vapor deposition (CVD) is an alternate process technique. Equivalents may also be used. The temperature for the sputtering process is low—20-0°-400° C., e.g., less than 400° C. and preferably less than 300° C. Evaporation can be used successfully, but this process requires careful control of an oxygen back-pressure and of substrate temperature during deposition.

(b) Cadmium Sulfide (CdS) Deposition: Sputtering is the preferred technique for cadmium sulfide deposition; chemical vapor deposition is an alternate technique. Equivalents may also be used. During sputtering, a sulfur back-pressure is maintained by the introduction of hydrogen sulfide ($H_2S$) during the deposition. Control of the hydrogen sulfide back pressure influences the stoichiometry of the deposited layer.

(5) Zinc Oxide Patterning (see also Step 6, following): Patterning of the zinc oxide is accomplished by conventional methods. It is performed in a bowl using a solution of hydrogen chloride HCl and water. The patterning step may be included with Step 6. It may be spray etched to decrease undercutting. Again, dry etch processes may be used. Suggested patterns are shown in FIG. 7.

(6) Resistive Blocking or Insulator Layer (see FIG. 4e): A thin (typically 10 to 200 nm) silicon dioxide ($SiO_2$) or other resistance layer on top of the zinc oxide (or cadmium sulfide) may be deposited to create a "blocking layer" 77 so as to limit electrical current flow. The thickness of this layer should be selected so as not to excessively limit the a-c current flow to the device at resonance. Other insulators may be used, including, for example but not limitation, silicon nitride ($Si_3N_4$), aluminum oxide ($Al_2O_3$), or the like, and organic insulators such as polyimide, paralene, and polytetrafluoroethylene.

Silicon dioxide, which is easily handled in the lab, may be deposited by either sputtering or electron beam evaporation. It is etched in a solution of hydrofluoric acid (HF) and water.

The zinc oxide and silicon dioxide may be deposited in the same thin film cycle, patterned once by conventional methods, and subsequently etched with hydrofluoric acid solution (for silicon dioxide) first, followed by etching of the zinc oxide in a solution of hydrochloric acid (HCl) and water.

(7) Insulating Layer (FIGS. 4f and 4g): The layer of insulating material 78 must be deposited so that the subsequent upper metallization layer (terminal connection conduction paths) can be prevented from making undesired electrical contact to the conductive ribbon 75 material or to the lower electrode (the ribbon metal may serve as the lower electrode). Polyimide has been used as an insulator because of its step coverage capability and because it may be deposited at the lower temperatures crucial for the lamination process. However, other materials that could be deposited by a plasma CVD process such as $SiO_2$, and $Si_3N_4$ should also work as well as an insulating layer. The insulating layer 78 is generally relatively thick (10 microns) so as to reduce stray or shunt capacitance in the device. Experimental resonant structures were made with du Pont P12555 polyimide insulation, prebaked at 90° C. for fifteen minutes. The polyimide is etched by conventional methods during the development cycle of the positive resist. It is then stripped of resist, as with n-butyl acetate, and cured at about 200° C. for one hour.

(8) Conductor Metallization (see FIG. 4g): Where an electrically conductive path to the piezoelectric material 76 is required (as for electrical excitation/detection), aluminum (Al) has been used for a conductor metallization layer 79. Other materials might also be used, examples include: chrome-silver (Cr/Ag), titanium-tungsten gold (Ti/W/Au), platinum (Pt), chromium (Cr), and titanium (Ti). In making the experimental resonant structures, approximately one micron of aluminum was deposited for the conductor metallization. After conventional patterning of the conductor metallization 79, it is etched in ordinary aluminum etchant, which etching is facilitated at a slightly elevated temperature, e.g., 50° C. It is important that the etchant used to pattern the selected metal must not attack other parts of the device.

Following the etch step, the resist is removed and the device(s) cleaned and rinsed in de-ionized water.

(9) Removal of Devices: The devices are removed from the substrate 70 and epoxy 71 by peeling them away from the substrate with suitable tweezers. In the case of some epoxy laminates, the substrates may be heated to approximately 100° C. to facilitate the removal process. This reduces the adhesion of the epoxy, allowing the devices to be peeled away easily.

DEPOSITED METAL LAYER PROCEDURE

In an alternate process, the metal may be plated or otherwise deposited to form the basis of making ribbon resonators. The procedure then is similar to that using laminated foils.

A number of materials (including for example but not limitation nickel, copper, berylium-copper alloy, chrome, gold, silver, platinum) which could be used for resonant ribbons can be deposited by techniques such as plating, vacuum evaporation, or sputtering. The chief disadvantage of such material is that the crystalline boundaries tend to orient themselves perpendicular to the plane of the deposited material. The yield strength of the metal in its plane would thus be expected to be lower than it might be if the grain boundaries were parallel to the stress. Advantages of this method, however, include higher temperature processing.

A procedure for the plating/deposition method of fabricating microminiature resonant structures follows:

(1) Substrate Selection: In order to fabricate the resonant structures using planar techniques, it is desirable to have a rigid workpiece. A rigid substrate is used to provide suitable sample rigidity. The substrate could be made from any suitable material which has good dimensional stability, can withstand temperatures up to 200° C., and is resistant to the etchants used in the process. Glass is an inexpensive, readily available material, and is present in the preferred form: 75 to 150 mm (3-6-inch) diameter wafers. 0.25 mm (10 mil) thick, "0211" cover glass from Corning Glass Company may be used.

(2) Substrate Preparation: The substrate must be prepared for the application of the metallization layer. A release agent of some sort must be employed so that the final product can be removed from the substrate in an undamaged condition. To do this, a thin (100 nanometer) layer of copper has been employed experimentally. Copper is appropriate because it adheres to the glass sufficiently well to survive all the processing steps, but not so perfectly that easy removal of the finished devices from the substrates is prevented. Copper is also conductive, allowing it to be plated without the need for additional conductive layers. Alternatively, a material with poor mechanical integrity such as copper oxide might be employed as a release agent. Germanium (Ge) also represents a useful alternative because it is soluble in many acids and bases, and exhibits good mechanical integrity during the process. It must be metallized, if plating is the means of deposition for the resonator material. Finally, a material such as a polymer or even an inorganic compound, could be applied and later dissolved from beneath the devices.

Figure 5A:
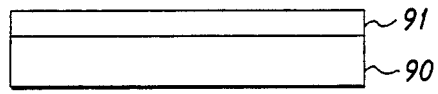
FIGS. 5a through 5f illustrate the plating process for fabricating essentially flat resonant structures, such as ribbons or double tuning forks.

(3) Metal Deposition (see FIG. 5a): The thickness of the deposited ribbon material itself is dependent on the geometry and expected stress in the device. The metal layer is deposited on the substrate using any suitable deposition technique, including for example sputtering, chemical vapor deposition (CVD), thermal evaporation, electron beam evaporation, and plasma enhanced chemical vapor deposition. Plating and chemical vapor deposition up to several hundred microns in thickness are possible while evaporation (both electron beam and thermal) and sputtering are limited to about 10 microns maximum thickness. The higher the yield strength of the material, the greater the operating frequency range. Nickel plating may well improve yield strength of metallic materials.

Figure 5B:
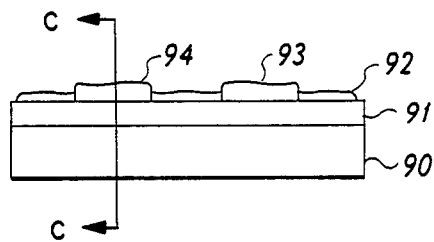
Figure 5C:
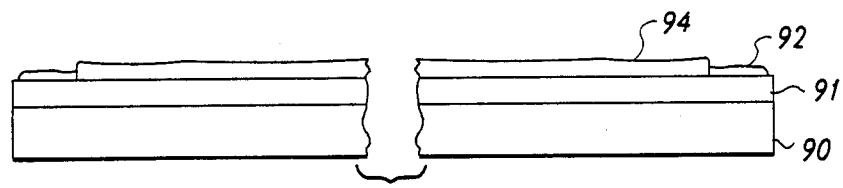
Figure 5D:
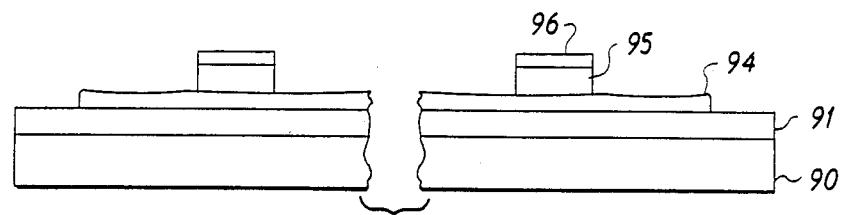

Experimentally, a thin layer of copper 91 was deposited on a 75 mm (3-inch) diameter 0211 Corning glass substrate 90. The substrate 90 was patterned [patterning may be accomplished by conventional methods with any of a number of resist materials known to one skilled in the microfabrication arts; both positive (AZ1300 Series) and negative resist have been used successfully]. See FIG. 5b. A positive resist such as AZ1375 was used and spun on at a low rate (2,000 rpm). The resist was exposed and developed so as to create a multiplicity of ribbon resist patterns 92 on the copper coated substrate. Two are shown. The resist was absent in the areas where the plated ribbons were to be formed. See FIGS. 5b and c. FIG. 5c is a transverse section taken at line C—C of FIG. 5b showing a single ribbon element 94 along its length, with middle portions removed for clarity of illustration. Plating was performed in a tank using commercially available Technics Watts nickel plating solution and the current density and temperature conditions recommended by the supplier. Plating is continued to a thickness of about 12 microns. After plating, the resist was removed (in acetone), other conventional methods and materials could be used followed by a methanol or isopropyl (or equivalent) rinse, followed by a de-ionized water cascade rinse. The sample was then ready for piezoelectric deposition. See FIG. 5d.

Figure 5E:
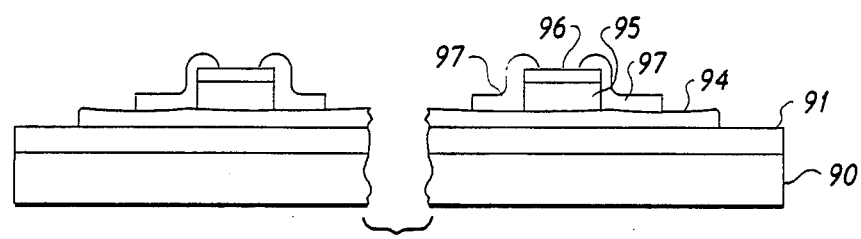
Figure 5F:
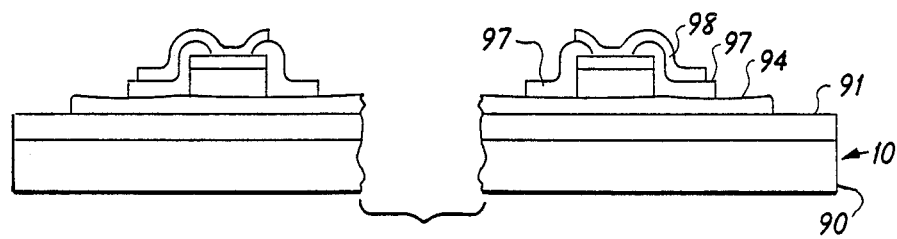
Figure 6A:
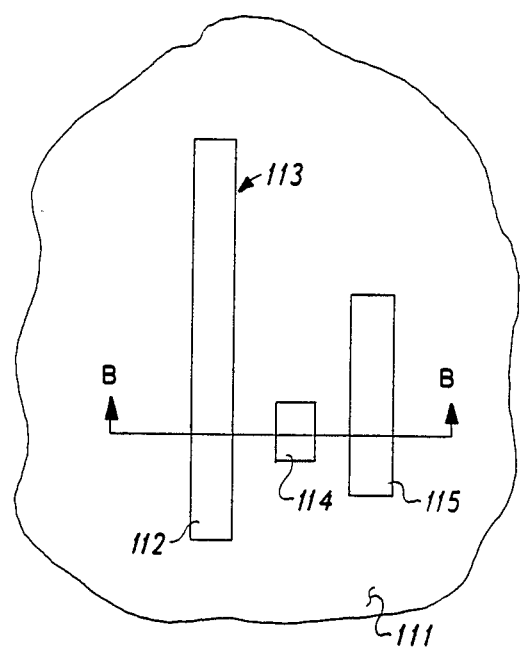
Figure 6B:
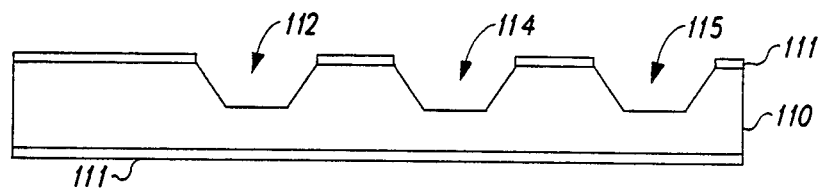
Figure 6I:
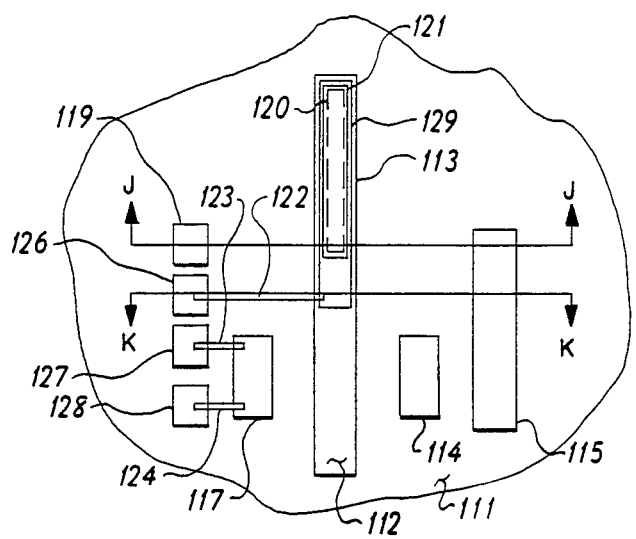
Figure 6J:
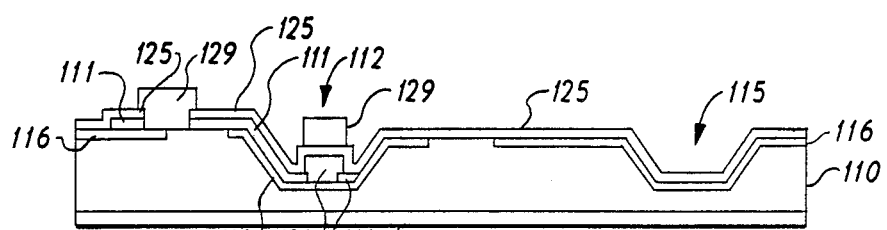
Figure 6K:
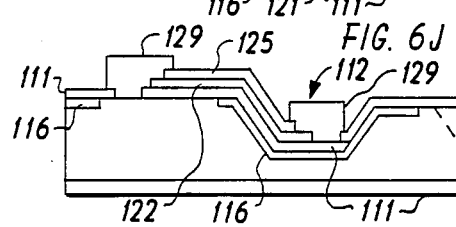

The process continues with piezoelectric material 95 deposition and resistance or blocking layer 96 as in the foregoing process, proceeding from step 4 thereof. See FIGS. 5e and 5f. An insulating layer 97 is applied as with FIG. 4, followed by a suitable conductor metallization 98. See FIGS. 5e and f. Again, completed resonant structures can be removed at room temperature using sharp tweezers or a knife to lift the corner of one end. Once lifted, the resonator peels from the substrate easily.

(b) Beam Structures

Piezoelectrically driven and sensed resonant structures such as single- and double-ended double beam resonant structures (e.g., single- and-double-ended tuning fork structures) may be made according to the following general method:

1. The resonant structure is fabricated of the desired material.
2. Piezoelectric material is deposited, then patterned and etched to remove unwanted piezoelectric material from the remainder of the workpiece.
3. An insulating layer, if necessary, may be deposited and patterned.
4. A thin metal layer is deposited and defined, to provide electrical connector points for the piezoelectric circuit.
5. A thick metal layer is then deposited and defined, if desired.
6. An insulating layer may be deposited if desired.

More particularly, piezoelectrically driven and sensed silicon hollow cantilever beam resonant elements can be produced according to the following detailed procedure: (See FIGS. 6a through 6k)

1. N-type [100] silicon wafer material, polished on both sides, is a suitable substrate 110 material. See FIG. 6a. A silicon dioxide ($SiO_2$) mask layer 111 is thermally (or equivalent) grown, on both sides (front and reverse) of first and second areas (only one is shown) of a selected silicon (Si) wafer 110, to a thickness of from 0.3 to 1.0 microns, and preferably approximately 0.3 microns. The mask layer 111 may also be formed by chemical vapor depositions (CVD), electron beam (E-beam) evaporation, by sputtering or by an equivalent method. Alignment marks are masked by conventional methods on the reverse side (not shown). The front side oxide layer 111 on each wafer area is patterned by conventional methods to provide a beam trough 112, an electronics cap 114, and a contact cap 115 on the front surface, and is then etched by the usual wet or dry methods [wet methods include hydrofluoric acid (HF); dry methods include plasma etch], preferably in hydrofluoric acid (HF) to leave precisely positioned alignment marks in the back surfaces of each wafer area and to define the device element shapes in the front surfaces of each wafer area. The front surface of each wafer area then has a beam trough 112, an electronics cap 114, and a contact cap 115 etched in it, using potassium hydroxide (KOH) or equivalent anisotropic etchant. The troughs are etched to the appropriate mask outline, for example trough mask outline 113. The electronics cap 114 and/or contact cap 115 may be omitted if not required.

2. See FIGS. 6c, 6d, and 6e. The silicon dioxide mask layer 111 is then stripped from the respective wafer areas with dilute hydrofluoric (HF) acid and thermally regrown to a thickness of from about 0.5 to about 1.5 microns, preferably about 0.7 microns. The new oxide mask layer 111 may also be formed by CVD, E-beam evaporation, or by sputtering. This silicon dioxide layer 111 is patterned by conventional methods on each wafer area, and conventionally etched in dilute hydrofluoric acid (HF) to provide a silicon-dioxide mask for the p+ doping step. An undoped area 118 (FIG. 6c) is left for later etching to free the beam. Boron (B), boron nitride (BN), boron (or boric) oxide ($B_2O_3$), or ion implantation, e.g., diborane gas ($B_2H_6$) and equivalents may be used in the p+ doping step. The doped areas 116 are shown in FIG. 6e. This mask 117 protects the electronics area and the adjacent cap areas 114, 115 of the wafer, and also defines the p+ doping of N-type [100] silicon outline of the beam shape. The outline definition of the beam shape includes the wall thickness, support wing areas, beam sealing boundaries, and so forth. See U.S. patent application Ser. No. 709,870.

3. The silicon dioxide doping mask layer 111 is stripped from both wafer areas by hydrofluoric acid (HF) etching and a new silicon dioxide layer (111) is thermally grown over both wafer areas to a thickness of from about 0.2 to about 0.6 microns, preferably approximately 0.2 microns. The new dioxide layer may alternatively be formed by chemical vapor deposition, E-beam evaporation, or by sputtering.

4. Such electronics circuitry (see FIGS. 6c and 6e) as is desired is now patterned in the first wafer front surface to form an electronics mask area 117. Specific circuitry and masks for such are within the skill of the ordinary artisan in the IC fabrication arts, and may in any case vary according to the intended use for the sensor. The electronics formation step may also be omitted where not needed.

5. This new silicon dioxide mask layer 111 (both wafer front surface areas) is patterned (see FIGS. 6f, 6g, and 6h) with a mask by conventional methods, etched in hydrofluoric (HF) acid or equivalent so that a contact aperture to the p+ doped area 120 inside the trough 112 is opened, and so that a contact aperture 119 to the p+ doped wafer front surface area is opened in the contact area. See FIGS. 6f, 6g, and 6h.

6. Next, the piezoelectric material is deposited using conventional masking and patterning techniques and etched so that the piezoelectric material 121 remains only in the desired trough area of the respective wafer areas. See FIGS. 6f, 6g, and 6h. Examples of suitable piezoelectric materials include zinc oxide (ZnO), [which may be etched in dilute hydrochloric acid (HC2)], cadmium sulfide (CdS), and lead oxide (PbO).

7. After the excess piezoelectric material 121 is etched away, a thin metal layer 122 from about 0.03 to about 0.1 micron thick, preferably near 0.1 micron in thickness is selectively deposited on each wafer front surface area (after definition) using conventional photoresist lift-off techniques. The metal layer is preferably formed of aluminum (Al), titanium (Ti), nickel (Ni), platinum (Pt), silver (Ag), or copper (Cu), or alloys thereof, or the like; lower temperature materials are preferred. This metal layer 122 will be used as a connector lead for the piezoelectric areas (if required) and for connections 123, 124 to the electronics package 117 (if desired). The photoresist is removed with acetone, N-butyl acetate, or the equivalent.

8. The wafer front surface areas are then covered by a deposited high resistance [silicon nitride ($Si_3N_4$) or silicon dioxide ($SiO_2$)] insulation layer (125). See FIGS. 6f, 6g, and 6h. A layer from about 0.1 to about 1 micron, preferably approximately 0.1 micron in thickness is suitable.

9. Contact apertures 126, 127, 128 are opened through the high resistance layer 125 by conventional masking and etching (conventional wet or dry methods) to the contact pads, and a thick metal layer 129 (Al, Ti, Ni, P+, Ag, Cu) is then deposited to a thickness from about 0.5 to about 2 microns and conventionally etched as desired. See FIGS. 6f, 6g, and 6h. This thick metal layer 129 provides contact pads 119, 127, 128 in the contact area, and connects to the thin metal layer 122, 123, 124, and also defines the shape of the piezoelectric electrode.

10. The reverse side silicon dioxide layer 111 is then patterned by conventional methods to provide the final etch mask. See FIGS. 6i and 6j. A bonding material is then deposited on the front surface of both wafer areas. Suitable bonding materials are described in U.S. patent application Ser. No. 709,897.

11. The front surfaces of the two portions of the wafer are precisely aligned and bonded together according to the rear surface registration marks, and then etched by a suitable anisotropic etchant to relieve the hollow beam and the contact areas. See U.S. patent application Ser. No. 709,870. Suitable etchants include potassium hydroxide (KOH), hydrazine ($N_2H_4$ or $NH_2NH_2$), ethylene diamine pyrocathecal (EDP), or sodium hydroxide and water (NaOH and $H_2O$). The bonding step hermetically seals the electronics package.

Finally, the device is cleaned (after etching) in a water rinse, then dried in alcohol. A slightly elevated temperature facilitates drying.

The areas of sensitive piezoelectric material may be located at any of numerous locations (and combinations of locations) on the resonant structure surface including interior surfaces of hollow structures. Additionally, the piezoelectric material may be driven by electrical or optical energy as is described hereinafter. For the following discussion, "excitation" of the piezoelectric material areas will be understood to include either electrical or photooptic stimulation/detection, and both or combinations of both.

Figure 7A:
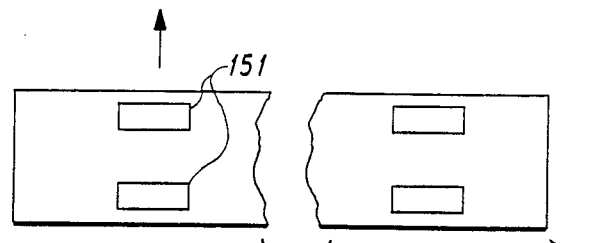
FIGS. 7a through 7l illustrate various suggested locations for the thin film piezoelectric depositions.
Figure 7B:
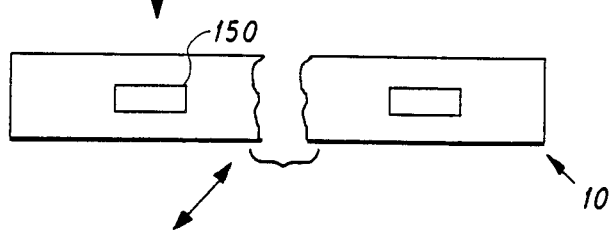

Turning to FIGS. 7a and 7b, a single beam (e.g., a ribbon) resonant device 10 is shown in plan view. Single 150 or double 151 (e.g., parallel-placed) piezoelectric material areas may be deposited at one or both ends (FIG. 7a, FIG. 7b, or in the middle (not shown). Each area, or double area, may serve either as a drive area or as a detection area [piezoelectric materials are characterized by the properties of: (a) producing a voltage when subjected to mechanical stress and (b) undergoing mechanical stress when subjected to a voltage]. By applying electrical or radiant energy drive excitation out of phase to any of the piezoelectric areas of a double area (or pair-group) 151, the ribbon resonator 10 of FIG. 7b may be oscillated in a direction parallel to that of this plan view. Any of the remaining areas or pair groups may be used to generate an electrical signal for detection of the resonating element frequency as an indication of the tension placed on the ribbon. The frequency may also be detected optically. It should be noted that drive detection may also be accomplished by an initial excitation pulse of energy having a duration significantly shorter than that of the resonant frequency, then detecting the resonant frequency in the remainder of the cycle or over more than one discrete, oscillation cycle. These techniques are generally known to those artisans of ordinary skill within the process control instrumentation field and are well understood.

Figure 7C:
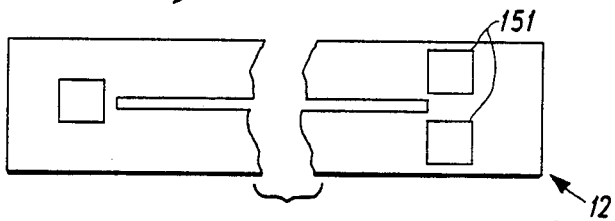

A double-ended or twin-beam device, e.g., a so-called double tuning fork 12 may also be driven to oscillation and detected according to the present invention by selectively placing piezoelectric material depositions at the notches of the bifurcations, as shown on the left side of FIG. 7c, one for sensing and a second for detecting. Pair-group piezoelectric areas may be placed alongside the bifurcations as shown on the right side of FIG. 7c or in 7d for more efficient drive/detection. A single tuning fork 14 may be excited and detected by either of these methods, FIG. 7j.

Figure 7E:
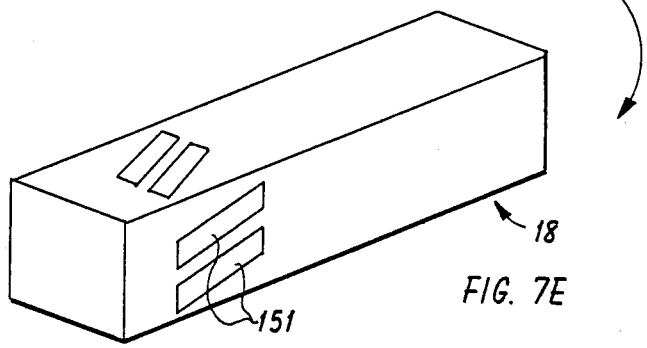
Figure 7D:
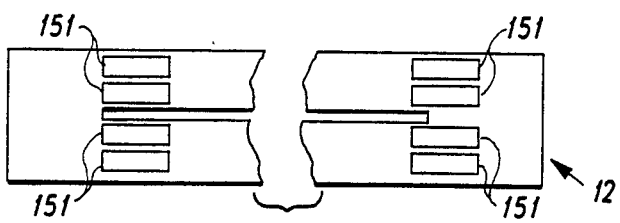
Figure 7F:
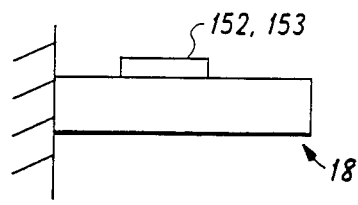
Figure 7G:
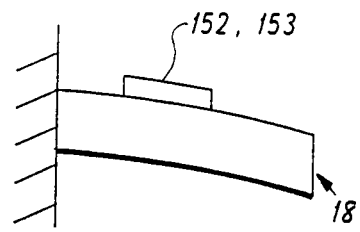
Figure 7H:
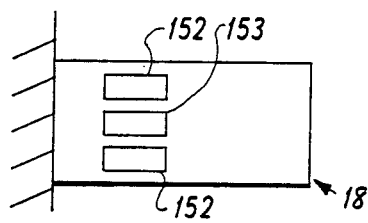
Figure 7I:
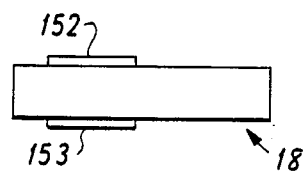
Figure 7J:
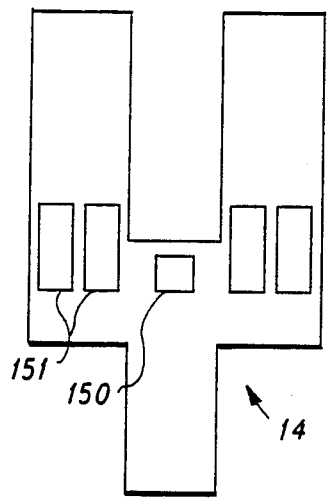
Figure 7K:
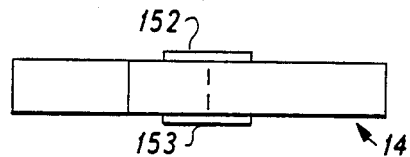

There is shown in FIGS. 7f and 7k suggested locations for deposition of the piezoelectric driven areas 152 on a cantilevered beam resonator (not a hollow beam resonator) in which multiple depositions are made on the upper and/or lower planar surfaces of the beam such that the beam deflects during excitation, which excitation produces mechanical stress to generate a voltage in the remaining piezoelectric area 153.

In addition to the numerous other configurations of resonant structure/piezoelectric material deposition placement, it should be noted that torsional oscillation of an elongated structure can be accomplished by placing elongated piezoelectric areas diagonally along a beam (or other resonator) surface, as is shown in FIG. 7e.

Figure 7L:
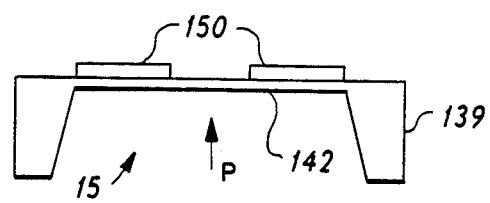

Additionally, diaphragm pressure sensors 15 such as that shown in cross-section in FIG. 7l may be driven to oscillation and then detected by placing piezoelectric areas 150 adjacent the diaphragm 15 area. The diaphragm 15 is supported over a diaphragm support substrate 142 and subjected to a pressure F.

The resonant structures described herein may also be driven and sensed by methods and apparatus similar to those used with the larger resonant structures known to those of ordinary skill in the process control instrumentation arts.

Figure 8A:
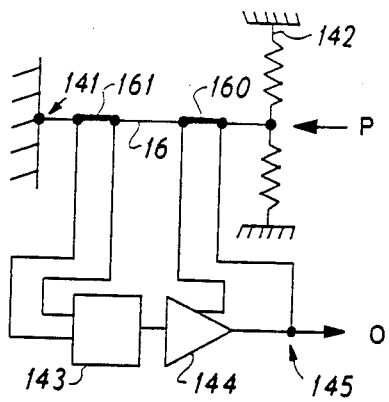
FIGS. 8a and 8b illustrate suggested electrical drive and detection circuits.
Figure 8B:
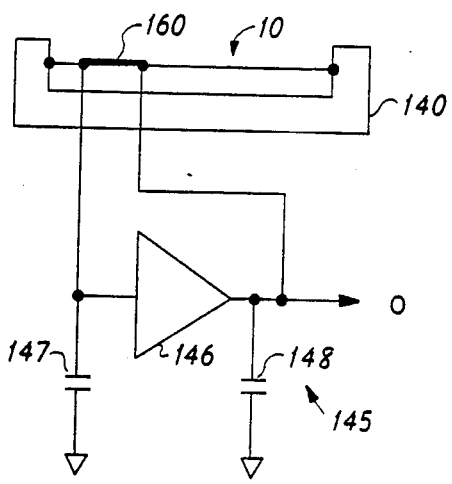

In perhaps the simplest form (see FIG. 8b), a resonant ribbon 10 may be stretched between clamping ends of a simple device of a material having a high temperature coefficient of expansion such as temperature sensor substructure 140, as shown in FIG. 8b. Similarly, a resonant element 16 (FIG. 8a) which may be a ribbon, double tuning fork, or other resonant structure according to this invention, may be suspended under tension between a fixed point 141 and a flexible element 142 which may be, for example but not limitation, a diaphragm or a bellows sensing a pressure (P) measurand as shown in FIG. 8a. Hollow beam structures may be filled with a variable pressure related to a measurand [pressure, differential pressure, temperature (via a filled thermal sensor) or other force], thus changing the resonant frequency of the hollow beam structure.

Electrical excitation is accomplished in many ways, and depends largely on the configuration and placement of the piezoelectric material. FIG. 8a shows a basic oscillator circuit, including a phase shift circuit 143 and gain stage 144, and having an output at 0. FIG. 8a illustrates a simple oscillator employing both drive and detector piezoelectric 160, 161 depositions on a simple ribbon sensor 10 connected between a fixed point 141 and a diaphragm 142 which is subjected to a pressure P.

In FIG. 8b, capacitors 147 and 148 provide phase shift and gain stage 146 provides the needed amplification, while piezoelectric element 160 provides the required oscillatory feedback. In some situations, it may be desirable to drive the resonant element in a plane other than perpendicular to the plane of the deposited piezoelectric material. In such a situation, pairs of piezoelectric material areas can be positioned and grouped (hence "pair-groups") to provide transverse oscillation, torsional oscillation, or oscillation in another mode. The individual piezoelectric areas of a particular pair-group are simply driven out of phase to achieve the desired piezoelectric stress. For sensing purposes, the detector area of piezoelectric material produces a voltage which varies regularly with the mechanical stress of the resonant structure. This effect can be used to feedback and sustain oscillation, as well as provide a resonance output signal or a separate piezoelectric area can be utilized to generate the resonance output signal.

Figure 9:
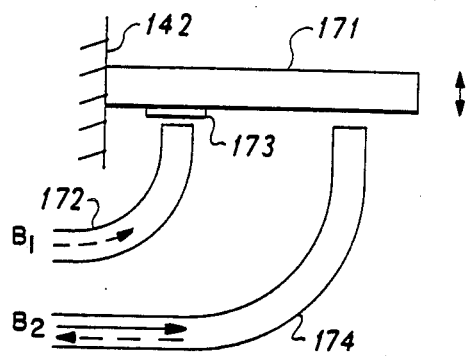
FIG. 9 shows optical drive/detection for a resonant structure according to the present invention.

FIG. 9 illustrates in simple form a single cantilever beam resonator 18 in which the beam 171 is attached at one end to a fixed point 142, the remaining end being free. A first fiber optic pathway 172 is driven remotely with an interrupted radiant energy beam $B_1$ which excites piezoelectric area 173, causing the cantilever beam 171 to oscillate. A second, steady radiant energy beam $B_2$ is launched down a second fiber optic pathway 174. Beam $B_2$ is alternately reflected depending on the oscillations of cantilevered beam 171 and returned via the second fiber optic 174 to a remote detection location (not shown). Note that a single fiber optic pathway can be substituted for pathways 172, 174 by using separate wavelengths of limited spectral dispersion for each function—drive of piezoelectric area 173 and reflection via oscillating cantilevered beam 171. U.S. patent application Ser. No. 350,687, filed on Feb. 22, 1982 by A. C. Gilby et al describes single and multiple pathway photo-optic drive and detection methods.

We claim:

1. A method of fabricating a laminar resonant structure, comprising the steps of:
   (a) preparing a substrate workpiece;
   (b) securing a laminar material to said substrate;
   (c) cleaning the exposed laminar material surface;
   (d) patterning a first resist on the laminar material surface;
   (e) descumming the resist;
   (f) etching the workpiece to form a resonant structure on the substrate;
   (g) cleaning and baking the workpiece;
   (h) depositing a piezoelectric layer on the workpiece surface;
   (i) patterning and etching the piezoelectric layer to form a piezoelectric slab:
   (j) cleaning and rinsing the workpiece;
   (k) applying an insulation layer on the workpiece surface and patterning same;
   (l) depositing a conductive metallization layer on the workpiece surface and patterning and etching same;
   (m) removing the resonant structure from the substrate.

2. The method of claim 1, wherein the laminar material is a metal.

3. The method of claim 1, wherein the substrate is a glass.

4. The method of claim 1, wherein the resonant structure formed is a ribbon.

5. The method of claim 1, wherein the resonant structure formed is a tuning fork.

6. The method of claim 5, wherein the resonant structure formed is a double tuning fork.

7. The method of claim 1, wherein the resonant structure formed is a cantilevered beam.

8. The method of claim 1, wherein the piezoelectric layer is zinc oxide.

9. The method of claim 1, wherein the piezoelectric layer is cadmium-sulfide.

10. The method of claim 1, wherein an anisotropic etchant process is used for step f.

11. A method of preparing a laminar resonant structure, comprising the steps of:
   (a) preparing a substrate workpiece;
   (b) depositing a metal layer on said substrate;
   (c) cleaning the exposed metal layer surface;
   (d) patterning a first resist on the metal surface;
   (e) descumming the resist;
   (f) etching the workpiece to form a resonant structure on the substrate;
   (g) cleaning and baking the workpiece;

(h) depositing a piezoelectric layer on the workpiece surface;
(i) patterning and etching the piezoelectric layer to form a piezoelectric slab;
(j) cleaning and rinsing the workpiece;
(k) applying an insulation layer on the workpiece surface and patterning same;
(l) depositing a conductive metallization layer on the insulation layer and patterning and etching same;
(m) removing resonant structure from the substrate.

12. The method of claim 11, wherein the laminar material is a metal.

13. The method of claim 12, wherein the substrate is a glass.

14. The method of claim 12, wherein the resonant structure formed is a ribbon.

15. The method of claim 12, wherein the resonant structure formed is a tuning fork.

16. The method of claim 15, wherein the resonant structure formed is a double tuning fork.

17. The method of claim 12, wherein the resonator formed is a cantilevered beam.

18. The method of claim 12, wherein the piezoelectric layer is zinc oxide.

19. The method of claim 12, wherein the piezoelectric layer is cadmium sulfide.

20. A method of preparing a hollow beam resonant structure comprising the steps of:
(a) etching at least one trough in the front face of a first substrate area,
(b) doping a selected trough area of said first substrate area to a predetermined etch-stop depth,
(c) depositing a piezoelectric material in a selected one of said at least one trough area,
(d) depositing a resistive insulation current blocking layer between said first substrate area and said piezoelectric material,
(e) depositing a metallization layer means for communicating drive and sense signals to said piezoelectric material,
(f) etching at least one complementary-image trough in the front face surface of a second substrate area,
(g) doping a selected trough area of said second substrate area to a predetermined etch-stop depth,
(h) aligning the first and second substrate areas in precise registration with their respective front face substrate surfaces joined,
(i) bonding said joined front face substrate surfaces together, and
(j) etching sufficient undoped substrate away from the doped substrate region to relieve the doped portion from the remaining substrate material, and leave a relieved, hollow microstructural cantilever beam.

21. A microfabricated laminar resonant microstructure for use in sensing a measurand, fabricated by the steps of:
(a) preparing a substrate;
(b) releasably securing a laminar material to said substrate;
(c) cleaning the exposed laminar material surface;
(d) patterning a first resist to outline on the laminar material surface the desired resonant microstructure workpiece;
(e) descumming the resist;
(f) etching the workpiece to form a resonant microstructure on the substrate;
(g) cleaning and baking the workpiece;
(h) depositing a piezoelectric layer on the workpiece surface;
(i) patterning and etching the piezoelectric layer to form at least one piezoelectric slab on the resonant microstructure;
(j) cleaning and rinsing the workpiece;
(k) applying an insulation layer on the workpiece surface and patterning same to outline areas for apertures through said insulation layer to the surface of the piezoelectric slab;
(l) etching through the insulating layer to the surface of the piezoelectric slab to provide apertures through said insulation layer and access to contact areas thereon;
(m) depositing a conductive metallization layer on at least a portion of the workpiece surface and patterning and etching same to form desired electrical contact areas through the insulation apertures to the piezoelectric slab underneath;
(n) removing the resonant structure from the substrate.

22. A microfabricated resonant microstructure for use in sensing a measurand, fabricated by the steps of:
(a) preparing a substrate;
(b) releasably depositing a metallization layer on said substrate;
(c) cleaning the exposed metallization layer surface;
(d) patterning a first resist to outline on the metallization surface the desired resonant microstructure;
(e) descumming the resist;
(f) etching the workpiece to form a resonant microstructure on the substrate;
(g) cleaning and baking the workpiece;
(h) depositing a piezoelectric layer on the workpiece surface;
(i) patterning and etching the piezoelectric layer to form at least one piezoelectric slab on the resonant microstructure
(j) cleaning and rinsing the workpiece;
(k) applying an insulation layer on the workpiece surface and patterning same to outline areas for apertures through said insulation layer to contact areas on the surface of the piezoelectric slab;
(l) etching through the insulating layer to the surface of the piezoelectric slab to provide apertures through said insulation layer and access to contact areas thereon;
(m) depositing a conductive metallization layer on at least a portion of the workpiece surface and patterning and etching means to form desired electrical contact areas through the insulation aperture to the piezoelectric slab underneath;
(n) removing the resonant structure from the substrate.

* * * * *